United States Patent
Clochard et al.

(10) Patent No.: US 10,928,935 B2
(45) Date of Patent: Feb. 23, 2021

(54) OPTICAL-EFFECT TOUCHPAD ON A STEERING WHEEL FOR FINGER DETECTION

(71) Applicants: CONTINENTAL AUTOMOTIVE FRANCE, Toulouse (FR); CONTINENTAL AUTOMOTIVE GMBH, Hanovre (DE)

(72) Inventors: Pascal Clochard, Chevreuse (FR); Jérôme Wroblewski, Thil (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/642,931

(22) PCT Filed: Sep. 4, 2018

(86) PCT No.: PCT/FR2018/052154
§ 371 (c)(1),
(2) Date: Feb. 28, 2020

(87) PCT Pub. No.: WO2019/048769
PCT Pub. Date: Mar. 14, 2019

(65) Prior Publication Data
US 2020/0348771 A1  Nov. 5, 2020

(30) Foreign Application Priority Data

Sep. 5, 2017 (FR) .................................. 1758164

(51) Int. Cl.
  *B60K 37/06* (2006.01)
  *B60D 1/06* (2006.01)
(Continued)

(52) U.S. Cl.
  CPC .......... *G06F 3/03547* (2013.01); *B60K 37/06* (2013.01); *B62D 1/06* (2013.01);
(Continued)

(58) Field of Classification Search
  CPC ... G06F 3/03547; G06F 3/0425; B60K 37/06; B60K 2370/21; B60K 2370/1468; B60K 2370/143; B62D 1/06
  See application file for complete search history.

(56) References Cited

U.S. PATENT DOCUMENTS 10,482,730 B2 * 11/2019 Takeda ................ G06F 3/03547
2014/0081521 A1 * 3/2014 Frojdh .................. G06F 3/0421
                                                                701/36
(Continued)

FOREIGN PATENT DOCUMENTS

DE    102015200907 A1   7/2016
FR        3023513 A1   1/2016
(Continued)

OTHER PUBLICATIONS

International Search Report, dated Dec. 13, 2018, from corresponding PCT application No. PCT/FR2018/052154.

*Primary Examiner* — Bryan Earles
(74) *Attorney, Agent, or Firm* — Nixon & Vanderhye

(57) ABSTRACT

A system for detecting command gestures made by a finger of a motor vehicle driver, including at least one interface pad, a light source that emits an infrared optical beam toward the interface pad, an imaging sensor, in order to capture images steered by the interface pad away from the driver, the interface pad including a base frame and a movable plate that is movable between a rest position and at least one activation position, the base frame including a first inclined edge and the movable plate including a second inclined edge, the first and second inclined edges forming a zone of contrasts of interest as seen by the imaging sensor,
(Continued)

and being separated by a space or brought closer together depending on the position of the movable plate, and generating a contrast effect in the images of the interface pad that are captured by the imaging sensor.

20 Claims, 5 Drawing Sheets

(51) Int. Cl.
  *G06F 3/042* (2006.01)
  *G06F 3/0354* (2013.01)
  *B62D 1/06* (2006.01)
(52) U.S. Cl.
  CPC ...... *G06F 3/0425* (2013.01); *B60K 2370/143* (2019.05); *B60K 2370/1468* (2019.05); *B60K 2370/21* (2019.05)

(56) References Cited

U.S. PATENT DOCUMENTS

| | | | |
|---|---|---|---|
| 2016/0132126 A1* | 5/2016 | van Laack | G06F 3/04842 345/156 |
| 2018/0095608 A1* | 4/2018 | Jablonski | G06F 3/02 |
| 2018/0292949 A1 | 10/2018 | Champinot et al. | |
| 2019/0385574 A1* | 12/2019 | Helot | G06F 1/1641 |

FOREIGN PATENT DOCUMENTS

| | | |
|---|---|---|
| FR | 3028222 A1 | 5/2016 |
| WO | 2016/150572 A1 | 9/2016 |

* cited by examiner

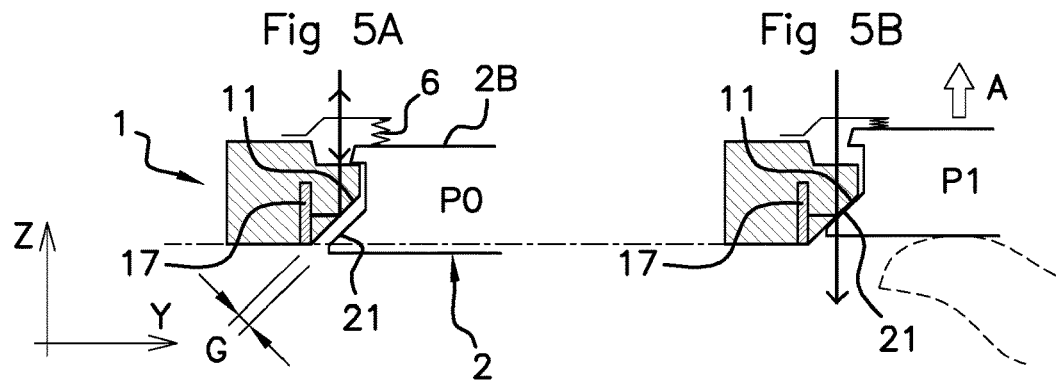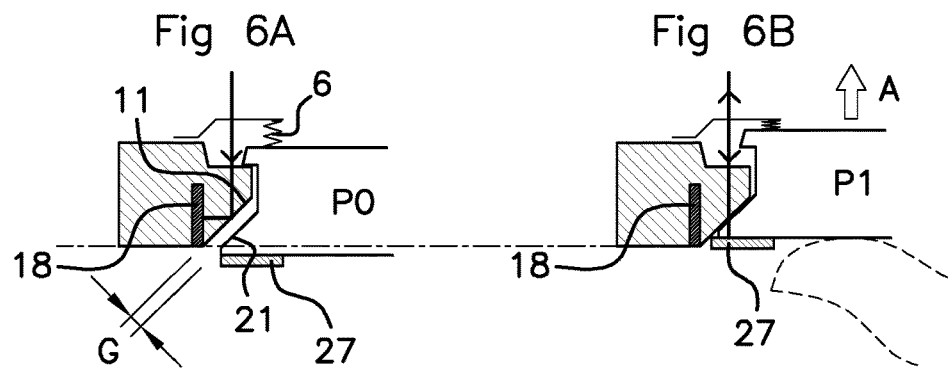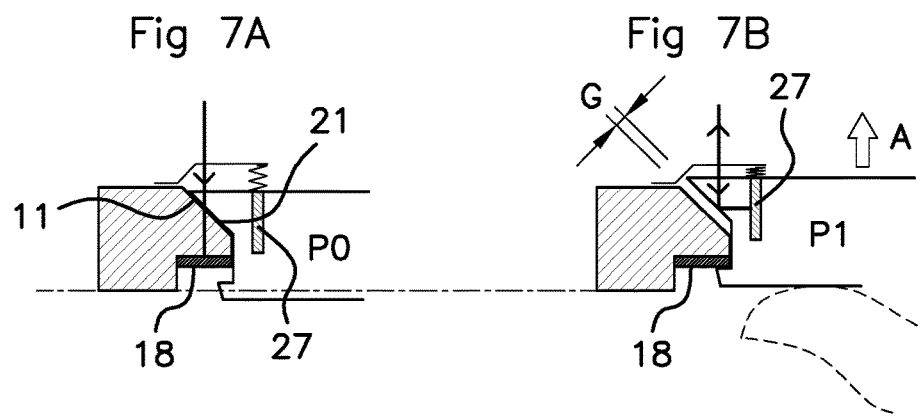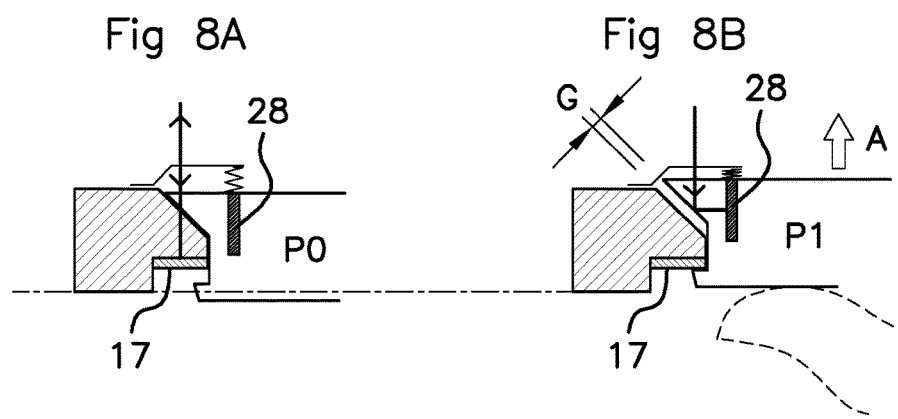

OPTICAL-EFFECT TOUCHPAD ON A STEERING WHEEL FOR FINGER DETECTION

BACKGROUND OF THE INVENTION

Field of the Invention

The present invention relates to the touchpads used on a steering wheel of a motor vehicle. More particularly, it relates to optical-effect touchpads for detecting finger gestures and/or touches by means of a standard camera, or more generally an imaging sensor.

Description of the Related Art

It is already well known to place control buttons in the spokes of the steering wheel that connect the central portion to the rim of the steering wheel, for example in order to control communication and/or audio functions or even the speed limiting/regulating function.

However, in the context of increasingly elaborate human-machine interfaces, this solution lacks flexibility because the buttons are dedicated. In addition, this requires a cabled electrical connection between the steering wheel and the rest of the vehicle.

Specifically, it is preferable to use solutions that do not require the presence of electronics inside the steering wheel and that do not require a cabled electrical connection between the steering wheel (which rotates) and the dashboard.

Moreover, it is highly recommendable for reasons of road safety to permanently keep the hands on the steering wheel or in immediate proximity to the latter, this providing motivation to place, on the steering wheel, human-machine interfaces that are accessible to the fingers of the driver when his hands are holding the rim, this objective however not always being compatible with the aforementioned constraints.

It has already been proposed to detect, by means of the type of camera referred to as a 3D camera, certain gestures made by the fingers of the driver when the fingers of the hand of the driver are located on a specific transparent pad in the vicinity of the steering wheel, as for example described in document FR 3 028 222. However, according to the proposed solution, it is necessary to make use of a specific camera (referred to as a "3D" camera) capable of measuring the distance with respect to each of the points of the objects seen in the field of view: this type of equipment is expensive. Moreover, it is very difficult to obtain a sufficient precision to determine whether the finger is touching the pad or whether the finger is not touching the pad, which difference is however very important from the point of view of the meaning of the gestures made by the fingers of the driver.

SUMMARY OF THE INVENTION

Therefore, the inventors have identified a need to provide other ways of achieving an interface for detecting command gestures on a touchpad in a steering wheel, without electronics in the steering wheel and without a cabled electrical connection between the steering wheel and the dashboard.

To this end, a system is proposed for detecting command gestures made by at least one finger of a driver of a motor vehicle, the system comprising:

at least one interface pad located in proximity to the rim of the steering wheel,
at least one light source that emits an optical beam mainly in the near-infrared band toward the interface pad,
an imaging sensor, for capturing at least images steered by the interface pad away from the driver, In this detecting system, the interface pad comprises a base frame and a movable plate that is movable between a rest position and at least one activation position obtained by pressing with a finger, the base frame and the movable plate lying generally in a reference plane XY and having a small thickness in the direction Z perpendicular to said reference plane XY. The base frame comprises a first inclined edge, which is beveled with respect to the reference plane XY, and the movable plate comprises a second inclined edge, which is beveled with respect to the reference plane XY, arranged parallel to and facing the first inclined edge in the direction Z, said first and second inclined edges forming a zone of contrasts of interest as seen by the imaging sensor, and wherein said first and second inclined edges are separated by a space or brought closer together depending on the position of the movable plate and together generate an effect of contrast, in the images of the interface pad that are captured by the imaging sensor, between the rest position and the activation position.

By virtue of such a system, the images captured by the imaging sensor are, in the location of the inclined edges, very different depending on whether the movable plate is in rest position or in activation position; thus a contrast effect is obtained under the effect of the press of a finger of the user that moves the movable plate into the activation position.

In other words, in the rest position, level with the inclined edges, depending on the optical configuration adopted, either a high coefficient of reflection of the light source, or a low coefficient of reflection, is on the whole obtained. Furthermore, in the activation position, the situation with respect to overall optical reflection is inverted, this generating the sought-after contrast effect.

Certain specific finger movements, such as a pseudo "click" or a pseudo "double-click", may thus be detected very reliably, with a reliability higher than that of prior-art image-processing operations that analyze how blurry the finger appears through the interface pad.

Advantageously, the driver keeps his hands on or in immediate proximity to the steering wheel, and may make, on the interface pad, command gestures while keeping good control of the steering wheel.

The imaging sensor is for example a video camera; generally, it is possible to speak of an optical sensor. The camera may be a conventional video camera or a 3D video camera as will be described in detail below.

The detected finger is a thumb or another finger.

In various embodiments of the invention, one or more of the following arrangements may also be used.

According to one mechanical option, in the rest position of the movable plate, the first and second inclined edges are separated by an interval at least of a preset distance (in other words an air gap), and in the activation position of the movable plate the first and second inclined edges make contact with each other at least on one portion of the periphery.

Thus, refraction occurs in the presence of the separating interval, whereas the opposite is true when contact is made between the two parts on account of their similar or identical refractive indices—there is no refraction where contact is made but instead a direct path, and it is this difference in path that is used to generate the optical contrast.

In addition, it will be noted that a natural end of travel is obtained when the plate is pressed and pushed into abutment. It is the closure of the interval that forms the abutment that stops the motion.

According to one alternative mechanical construction, in the rest position of the movable plate the first and second inclined edges make contact with each other at least on most of the periphery, and in the activation position of the movable plate, the first and second inclined edges are separated by at least one interval of a preset distance at least on one portion of the periphery.

This alternative follows mechanical logic that is the inverse of the preceding case, and which may be advantageous if it is desired to hide the peripheral strips behind a cover plate. This logic makes it possible for the interval to be opened only occasionally and thus to prevent dust from entering and eventually accumulating in the gap between the base frame and the movable plate.

In an optical configuration, in the case of presence of the interval, seen from the imaging sensor, a low degree of optical return is obtained by virtue of an absorbent strip provided on the refractive optical path, whereas in the absence of interval a high degree of optical return is obtained by virtue of a reflective strip provided on the direct optical path.

In the case where the interval exists without stress, and therefore by default, at rest the imaging sensor does not see the luminous border corresponding to the inclined edges, and, as soon as the movable plate is pressed, the border lights up from the point of view of the imaging sensor, this following a natural logic (the activation triggers the illumination).

In the case where the interval exists only in the presence of stress, the imaging sensor sees the luminous border most of the time in the location of the interface of the inclined edges, and observes a disappearance of this border when the user presses on the movable plate.

By "reflective strip", what is also meant is a strip that scatters or that has a catadioptric function.

According to one optical alternative, in the case of presence of the interval, seen from the imaging sensor, a high degree of optical return is obtained by virtue of a reflective strip provided on the refractive optical path, whereas in the absence of interval a low degree of optical return is obtained by virtue of an absence of reflection or by virtue of an absorbent strip provided on the direct optical path.

Here, the optical logic followed is inverted with respect to the preceding case; in the case where the interval exists without stress, and therefore by default, the imaging sensor sees the luminous border most of the time in the location of the interface of the inclined edges, and observes a disappearance of this border when the user presses on the movable plate.

In the case where the interval exists only in the presence of stress, then at rest the imaging sensor does not see the luminous order corresponding to the inclined edges, and, as soon as the movable plate is pressed, the border lights up from the point of view of the imaging sensor, this following a natural logic (the activation triggers the illumination).

According to one option, the base frame forms a peripheral zone around said movable plate. The movable plate is thus protected by the frame and does not risk being damaged; provision may also be made for a delineation by a pattern visible to the driver, who intuitively expects to find the activation zone in the central zone of the interface pad.

According to one option, the inclined edges run all the way around the perimeter of the movable plate. In other words, the inclined edges run all the way around the base frame. Image processing in the imaging sensor easily allows such a geometry to be identified and the position and orientation thereof to be determined.

According to another option, the inclined edges extend over only one portion of the perimeter. It is possible for example to have the inclined edges only on three sides, and more generally the zone of optical contrasts may be not be a connected space.

According to one option, the light source and the imaging sensor are arranged in proximity to each other; thus there is no biasing effect nor parallax effect.

According to one option, the light source and the imaging sensor are arranged in the vicinity of or in an instrument panel of the vehicle; integration is thus facilitated.

According to one option, the video camera in question (the imaging sensor) is also used for the drowsiness detection function; this makes it possible to use a single camera for two functions.

According to one option, the imaging sensor is a conventional video camera, i.e. without three-dimensional function; thus, a moderate cost, a choice of a high number of variants and a very small bulk are achieved.

According to one option, provision is made for a push-button effect. This reinforces intuitiveness and gives a feeling of quality to the useful travel, which is small in the present case.

According to one option, the movable plate is transparent at least to infrared light, so that the camera is able to detect movements of a finger inside the zone covered by the movable plate through the movable plate.

According to one option, the inclined peripheral strips are inclined at 45° with respect to the reference plane XY. Thus, a simple and reliable optical and geometric configuration is obtained.

According to one option, the light source emits in the 850-940 nm near-infrared band, and does not emit in the visible band. Thus, no discomfort is experienced by the driver or the other occupants of the vehicle, who see no spot of light in the instrument panel. Moreover, the emitted power in any case remains below the thresholds of ocular discomfort and/or hazard.

According to one option, provision is made for an elastic return to the rest position.

According to one option, provision is made to add an optical gel to one or both inclined edges in order to improve the contact. This allows possible imperfection in the planarity of the edges to be compensated for; said optical gel having a refractive index close to that of the materials of the base frame and of the movable plate.

BRIEF DESCRIPTION OF THE DRAWINGS

Other features and advantages of the invention will become apparent from the following description, which is given by way of nonlimiting example with reference to the appended drawings, in which:

FIGS. 5A and 5B show a cross-sectional view of a first embodiment cut along the section line V-V illustrated in FIG. 4, FIGS. 6A and 6B show a cross-sectional view of a second embodiment cut along the section line V-V illustrated in FIG. 4, FIGS. 7A and 7B show a cross-sectional view of a third embodiment cut along the section line V-V illustrated in FIG. 4, FIGS. 8A and 8B show a cross-sectional view of a fourth embodiment cut along the section line V-V illustrated in FIG. 4, FIGS. 9A and 9B show a cross-sectional view of a fifth embodiment cut along the section line V-V illustrated in FIG. 4.

In the various figures, the same references have been used to reference identical or similar elements. For the sake of clarity of the description, some elements are not shown to scale.

DESCRIPTION OF THE PREFERRED EMBODIMENTS

Figure 1:
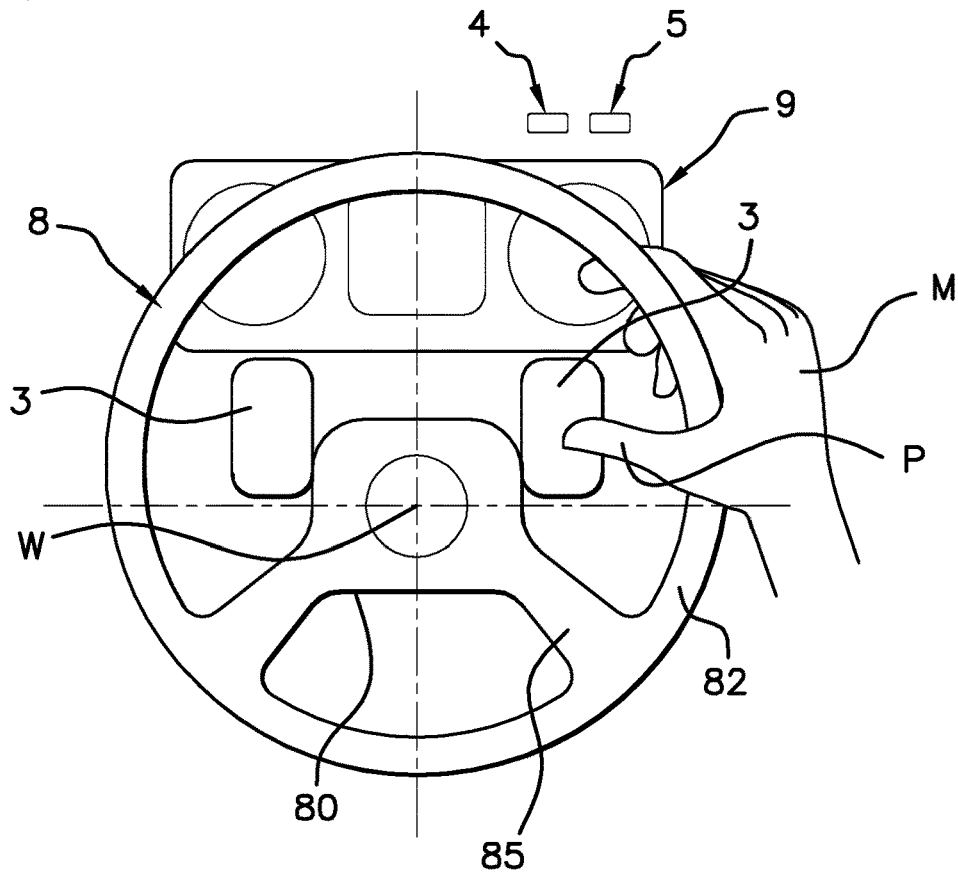
FIGS. 1 and 2 schematically show, face-on and in profile, respectively, a detecting system according to the present invention.

FIG. 1 shows a system for detecting command gestures made by a thumb P of a driver of a motor vehicle on an element that generally belongs to the steering wheel and that is referred to below as an interface pad 3 (described in detail below).

Below, the thumb of the hand M is denoted P, and all of the fingers (index finger, middle finger, etc.) are each denoted F.

The illustrated steering wheel 8 is of the type comprising two spokes 85 but, of course, the number of spokes has no bearing on the present invention, it may be 3, 4 or even 1 (case of a single-spoke steering wheel).

The steering wheel 8 rotates about an axis denoted W and comprises a hub and a rim 82 as known per se. The rim 82 may be shifted off-center with respect to the axis W, upward in straight-line configuration as illustrated in FIG. 1.

It is not excluded for the hub to comprise a central block 80 equipped with an airbag system; however, in one preferred variant, the airbags are located elsewhere in other portions of the cockpit and the steering wheel 8 is devoid of any electrical/electronic systems.

Behind the steering wheel 8 is positioned an instrument panel 9 as known per se. In this instrument panel 9, for example, provision is made for a light source 4 that mainly emits in the near-infrared domain (namely that containing wavelengths between 800 nm and 1100 nm), and an imaging sensor 5. This imaging sensor 5 is also referred to as a photographic sensor.

The images are captured by this imaging sensor 5 at a rate of a plurality of images per second, for example between 5 images per second and 25 images per second. This imaging sensor 5 may be a video camera, for example one based on a (color or monochromic) CCD sensor as known per se.

Preferably, the video camera is of a conventional two-dimensional type unable to measure depth. In other words, it is not a question of a "3D" video camera, this type of camera also sometimes being referred to as a time-of-flight camera.

However, the use of such a "3D" camera is not excluded in the context of the proposed solution.

Figure 3:
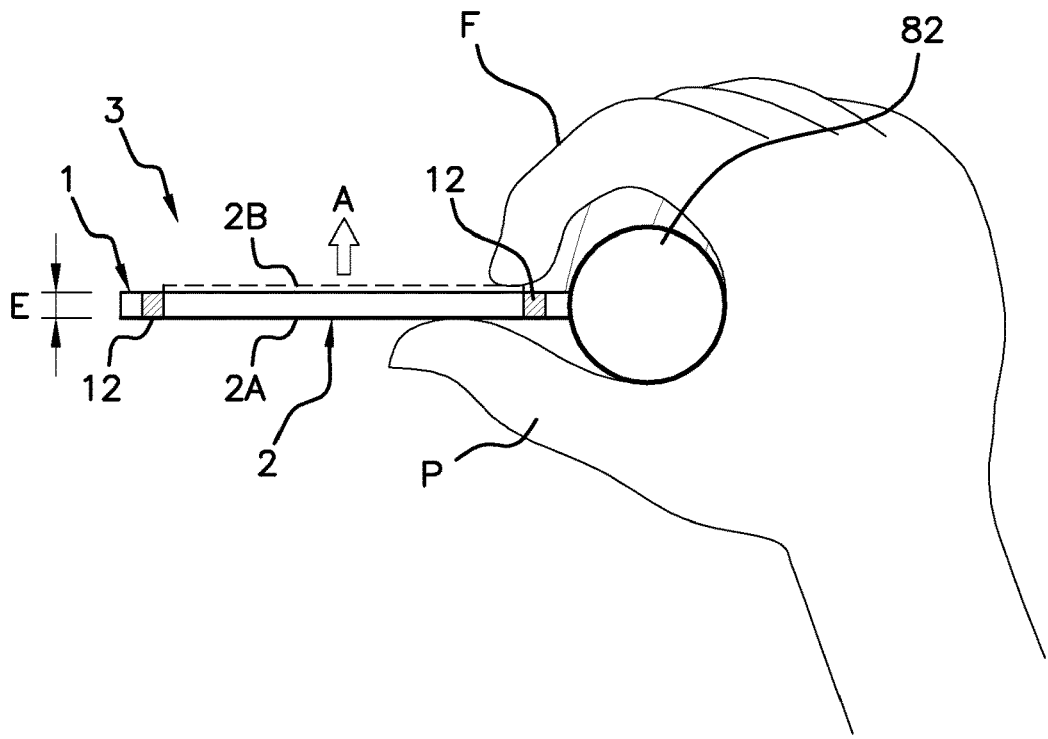
FIG. 3 shows a transverse cross-sectional view through the rim of the steering wheel with the interface pad.

In the example illustrated in FIG. 1, there are two interface pads 3, each attached to the central portion, and located on either side in proximity to the latter; of course, the interface pad 3 may also be located in proximity to the rim 82 of the steering wheel 8 and attached to the rim 82 as illustrated in FIG. 3.

The light source 4 emits an optical beam mainly in the infrared band toward the steering wheel 8, and in particular toward the interface pads 3.

A plurality of separate light sources 4 could be used. A plurality of cameras could also be used. However, preferably, the system is able to use a single camera, and even the same camera already used for the drowsiness detection function.

Preferably, the light source 4 and the video camera 5 are arranged in the vicinity of each other.

Alternatively, the light source 4 could be positioned not in the instrument panel 9 but in the vicinity of the latter; the same goes for the camera, which could be positioned not in the instrument panel 9 but in the vicinity of the latter, such as for example on the steering column of the steering wheel 8.

Figure 2:
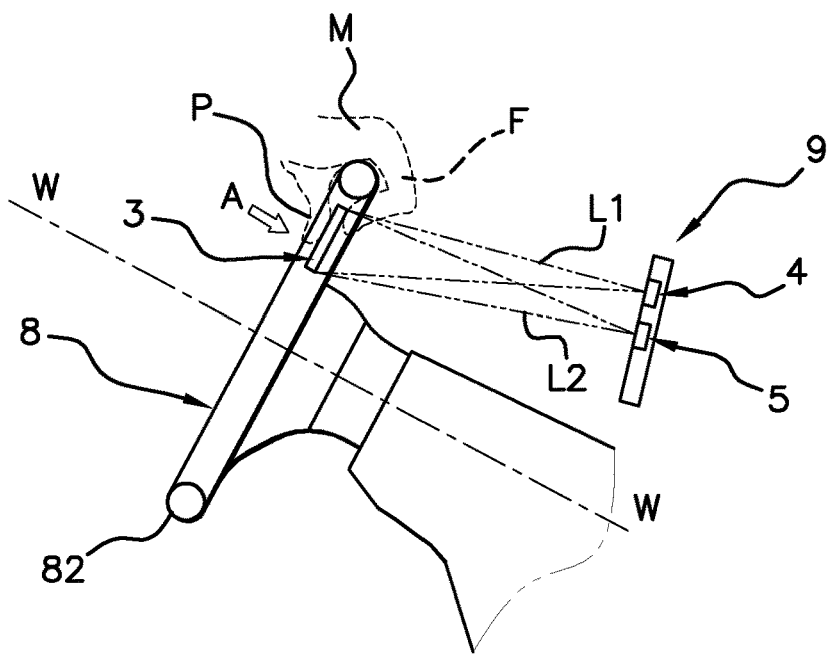

The light exiting from the light source 4 is emitted in the direction of the steering wheel 8 and of the driver (path denoted L1 in FIG. 2). Preferably, this light source 4 does not emit in the visible domain but mainly in the near-infrared domain.

Generally, the wavelength band [800 nm-1100 nm] is chosen, this band defining the near-infrared domain.

According to one particular option, the wavelength band [850 nm-940 nm] is chosen.

The light beam emitted by the light source 4 will preferably have a limited power, and in any case a power below the accepted thresholds of danger to the driver at the near-infrared wavelengths used.

Operation is ensured whatever the exterior ambient light conditions, i.e. not only under dark or dimpsy conditions, for example when driving at night, but also under daytime conditions and even under intense sunlight; the hood-down convertible version is also compatible and taken into consideration.

The video camera possesses a field of view that at least encompasses the possible positions of the interface pads 3 in the steering wheel 8. Here, it is the images captured by the camera of the zone of the interface pads 3 that are of interest, and in particular the light rays emitted by the source and returned to the objective of the camera via reflection from the interface pad 3 (path denoted L2 in FIG. 2).

The interface pad 3 comprises a base frame 1 that is securely fastened to the steering wheel 8 and a movable plate 2 (see FIG. 2). The base frame 1 and the movable plate 2 lie generally together in a reference plane, denoted XY, and have a thickness E in the direction Z perpendicular to said plane XY.

A small thickness E, for example a thickness smaller than 8 mm, and even, preferably, smaller than 5 mm will be selected (design refinement and lightness).

The interface pad 3A has a front face 2A that is visible to the driver and a back face 2B that is not visible to the driver.

The base frame 1 forms the peripheral zone of said interface pad 3 and encircles the movable plate 2, which lies generally in the central zone of the interface pad 3.

The movable plate 2 is movable between a rest position P0, which is adopted in the absence of exterior stress, and especially in the absence of a press of a finger, and an activation position P1 that is obtained by pressing the finger P forward (arrow "A" in the figures).

This movement is made possible by virtue of the presence of a hinging zone 12 that forms the mechanical and incidentally optical interface between the movable plate 2 and the base frame 1.

Figure 4:
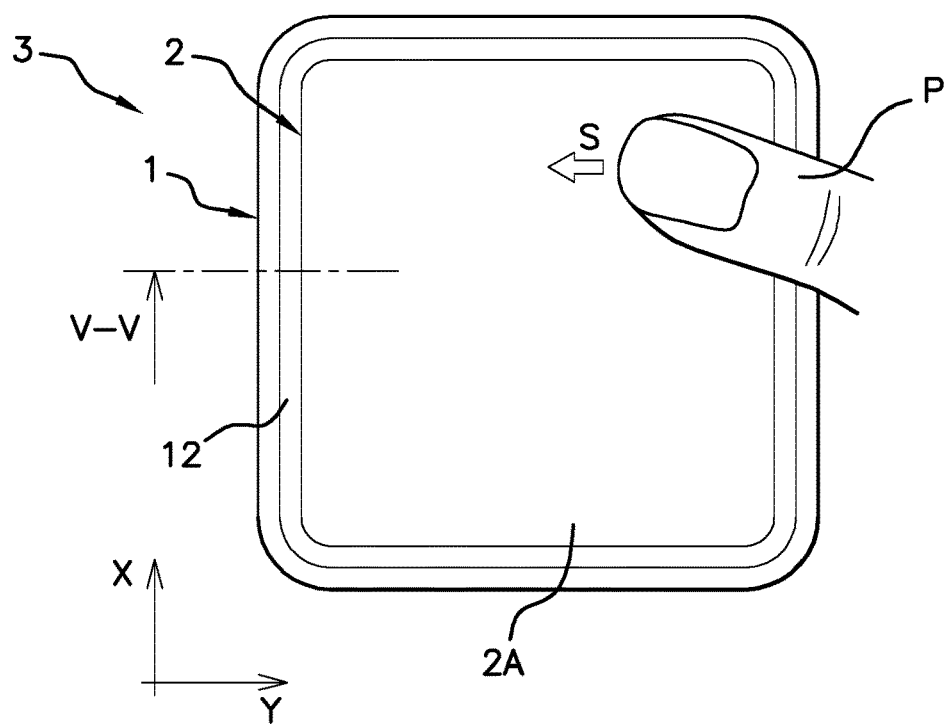
FIG. 4 shows, in more detail, a face-on view of the interface pad.

As in the example illustrated in FIG. 4, the hinging zone 12 may form a closed ring, i.e. completely encircle the movable plate 2. In the example illustrated in the figures, the movement used to displace the movable plate 2 is a quasi-translation along the axis Z.

According to other alternative solutions, the hinging zone could be different: a hinge could be located on one side and the inclined edges located opposite the hinge, the movement being a pivot about the hinge.

According to yet another solution, the movable plate 2 and the base frame 1 may be mechanically coupled independently of the optical arrangement that will be described in detail below.

As may be seen in FIGS. 5A and 5B and the following figures, the base frame 1 is equipped with an inclined edge, referenced 11, which is called the first inclined edge; the first inclined edge 11 is also said to be beveled with respect to the reference plane XY.

The movable plate 2 comprises an inclined edge 21, called the second inclined edge, which is also beveled with respect to the plane with the same local inclination.

The second inclined edge 21 is arranged parallel to and facing the first inclined edge 11 in the direction Z. Said first and second inclined edges together form a zone Z12 of interest of contrasts as seen by the camera.

In a first mechanical configuration (FIGS. 5A, 5B, 6A and 6B) in the absence of exterior stress P0, and in particular in the absence of a finger press, there is an interval between the first inclined edge 11 belonging to the base frame 1 and the second inclined edge 21 belonging to the movable plate 2. In the activation position P1, this interval is decreased to zero and the second inclined edge is brought into contact with the first inclined edge 11, providing in passing a natural stop, where appropriate with a push-button effect.

More precisely, according to the first embodiment, which is illustrated in FIGS. 5A and 5B, in the rest position P0, an interval G is observed between the first and second inclined edges. In this case, the light rays are refracted from the wall of the first inclined edge 11, as the optical path shows.

The interval G has a typical dimension of 1 mm, and generally a typical dimension comprised between 0.5 mm and 2 mm.

A reflective strip 17 having a reflective effect, at least on the near-infrared light rays, is provided, said strip being located precisely on the refracted optical path. This reflective strip 17 reflects the received light in the opposite direction, the inverse path also refracting from the first inclined edge 11 and therefore being directed toward the camera (path L2). The overall degree of optical return is therefore high, and the first inclined edge 11 is clearly visible in the images captured by the camera (reference Z12 FIG. 10).

In activation position P1 (see FIG. 5B) the interval G is cancelled, i.e. the second inclined edge 21 is adjacent to the first inclined edge 11. In this location, the incident light rays L1, instead of refracting, pass in a straight line because both materials have a refractive index that is similar or identical. The beam therefore passes through the interface pad 3. It does not annoy the driver because the beam does not contain any visible components, solely components in the infrared frequency band. According to one variant, an absorbent strip could also be placed on the front face 2A of the movable plate 2 in order to prevent the beam from dispersing toward the driver and other pieces of equipment of the vehicle.

In the second embodiment (FIG. 6A, position P0) the light rays are refracted from the wall of the first inclined edge 11, as the optical path shows, but a strip 18 that is absorbent in the near-infrared range is provided, and more precisely located on the refracted optical path. Therefore, the degree of return of the light beam is very low.

In contrast, in activation position P1 (shown in FIG. 6B) the interval G is cancelled, i.e. the second inclined edge 21 is adjacent to the first inclined edge 11. In this location, the incident light rays L1, instead of refracting, pass in a straight line because both materials have a refractive index that is similar or identical. The beam reflects from a reflective strip 27 and turns about to return in the direction of the interface of the inclined edges, where it once again passes in a straight line then returns to the camera. Therefore, the degree of return of the light beam is high.

It will be noted that a typical example with an inclination of 45° has been shown; however this is not obligatory; the inclination could be different provided that the reflective strips are oriented correctly so that they return the incident beam at 180°.

In an inverted mechanical configuration (FIGS. 7A, 7B, 8A and 8B) in the absence of exterior stress P0, and in particular in the absence of a finger press, the first inclined edge 11 belonging to the base frame 1 and the second inclined edge 21 belonging to the movable plate 2 make contact with each other, with optical continuity in this location. In the activation position P1, an interval G is created between the two inclined edges, with a discontinuity in refractive index and therefore an optical refraction at the first inclined edge 11.

FIG. 7A (position P0) shows passage in a straight line through the interface and absorption of the light signals by the absorbent strip 18, and therefore a very low degree of return to the camera.

FIG. 7B shows a refraction of 90° at the second inclined edge 21, then a total reflection from the reflective strip 27, then another refraction of 90° at the second inclined edge 21, and a return to the camera with a high degree of return.

FIG. 8A (position P0) shows passage in a straight line through the interface, a total reflection from the reflective strip 17 and a return to the camera with a high degree of return.

FIG. 8B shows a refraction of 90° at the second inclined edge 21, then an absorption of the signals by the absorbent strip 27 and therefore a very low degree of return to the camera.

With respect to materials, polycarbonate or PMMA or even silicone or an equivalent material will preferably be chosen for the base frame 1. The material in question may have a suppleness in order to facilitate correct mating of the surfaces in closed configuration (quality of the flattening).

A material of the same type will also be chosen for the movable plate 2, though it is not necessary for the material to be exactly the same depending on the sought-after mechanical properties. It is however preferable to choose materials with similar refractive indices.

It is not impossible for the base frame 1 or movable plate 2 to be an assembly of two materials, and in this case the zone of the inclined edges will preferably be made of polycarbonate, supple silicon or PMMA.

A material of refractive index substantially higher than that of air, and typically comprised between 1.3 and 1.6, will be chosen. According to one particular case, it is possible to choose an index such that the critical angle at which total reflection occurs is lower than or equal to 45°, i.e. an index higher than 1.41.

As mentioned above, in the absence of external mechanical stresses, the movable plate 2 is returned to the rest position P0 by return means.

In the example illustrated in FIGS. 6A to 8B, a solution the principle of which is based on a spring-type return means (referenced 6) is shown. However, the return force may be created by other means, for example elastic tabs that project either from the base frame 1 or from the movable plate 2 and which tend to repel the movable plate 2 in the direction of the driver, i.e. away from the instrument panel 9.

Figure 9A:
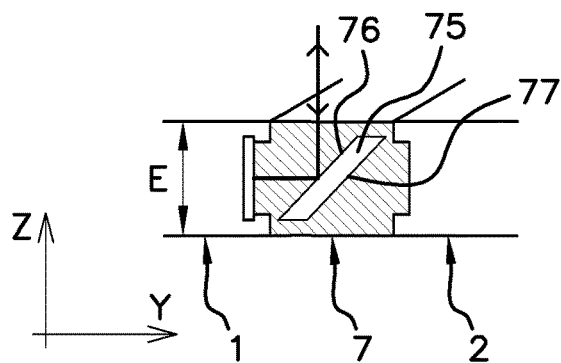
Figure 9B:
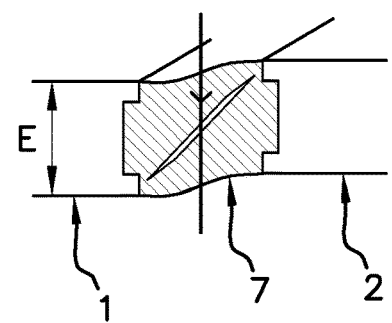

According to one alternative illustrated in FIGS. 9A and 9B, the mechanical interface and an optical interface are more intimately associated in an extruded elastic deformable seal referenced 7. The deformable seal 7 is interposed, substantially in the reference plane XY, between the base frame 1 and the movable plate 2.

In the profiled interior of the seal 7, provision is made for an internal cavity 75 that delineates an air-filled space. The walls 76, 77 of this cavity 75 are advantageously inclined with respect to the plane XY, just like the inclined edges of the preceding solutions; for example, with an inclination preferably equal to 45°.

When the user presses on the movable plate 2 with his thumb P, the seal 7 deforms and the internal cavity 75 is squashed until the two walls 76, 77 of this cavity 75 touch each other, i.e. make contact with each other; this creates a configuration of optical continuity in which the light rays are no longer refracted and pass directly without refraction, see FIG. 9B.

The deformable seal 7 may be mounted by conformal contact (tenon/mortise inter alia) inside grooves produced, on the one hand, in the base frame 1 and, on the other hand, in the movable plate 2, as illustrated in FIGS. 9A and 9B.

In this configuration, with such a deformable seal 7, which naturally generates a return force, it is possible to obtain a profile of very small thickness for the interface pad 3; the thickness E may be smaller than 4 mm, or even smaller than 3 mm.

It will be noted that with the deformable seal 7 the optical logic could be inverted, namely analogously to the logic illustrated in FIGS. 6A and 6B.

Figure 10:
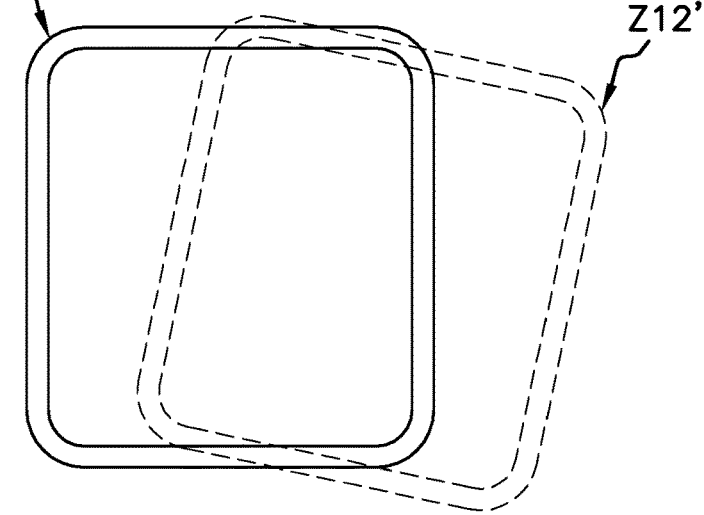
FIG. 10 shows an example of a frame of contrasts seen by the imaging sensor.

FIG. 10 illustrates the zone of contrasts of interest, denoted Z12, that corresponds to all the positions of the points of the inclined edges seen by the camera.

Figure 12:
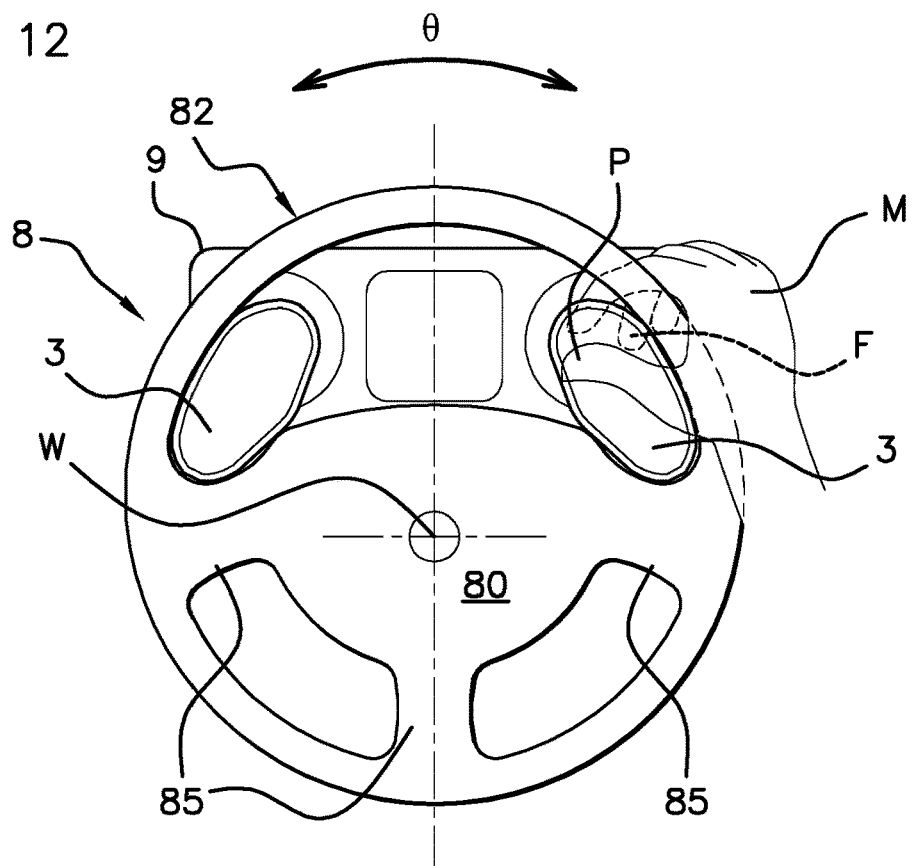
FIG. 12 shows another type of steering wheel and of interface pad.

In conjunction with FIG. 12, it will be understood that the zone of contrasts of interest Z12 may moreover adopt a different position Z12' if the steering wheel 8 is not completely straight; for example, if the driver is on a motorway with a slight curve, the steering wheel angle θ is not equal to zero, nonetheless road-safety conditions permit the driver to interact with an on-board system by virtue of the interface pad 3.

Figure 11:
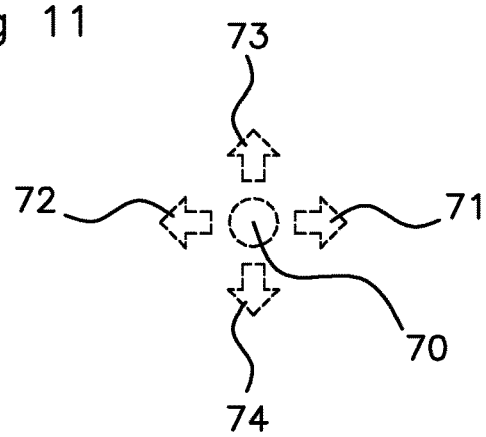
FIG. 11 shows the considered main typical movements of the thumb of the driver.

FIG. 11 illustrates various finger movements typical of a touchscreen human-machine interface: scroll to the right 71, scroll to the left 72, scroll upward 73, scroll downward 74 and "click" 70; the "click" 70 has the particularity that it is the contrast effect observed in the optical zone of interest Z12 that reveals the press and not simply the approach of a finger (analysis of the blurriness or clearness of the image of the finger) as in the prior art. Images captured through the movable plate 2 are analyzed to detect one of the aforementioned movements 71, 72, 73, 74.

Typical dimensions for the interface pad 3 may be 5×5 cm, but any other dimensions compatible with placement between the rim 82 of the steering wheel 8 and the hub of the steering wheel 8 may be chosen.

The width of the border forming the contrast-containing optical zone of interest is comprised between 3 and 6 mm.

It will be noted that it is possible to provide a cover plate on the front face 2A, said cover plate being intended to cover the optical and mechanical interface elements between the base frame 1 and the movable plate 2; advantageously, the internal face of such a cover plate may be reflective (see FIGS. 6A and 6B), the plate then being able to combine two functions.

It will be noted that the light source 4 may optionally be pulsed and the images analyzed synchronously with the activation of the light source 4.

Figure 13:
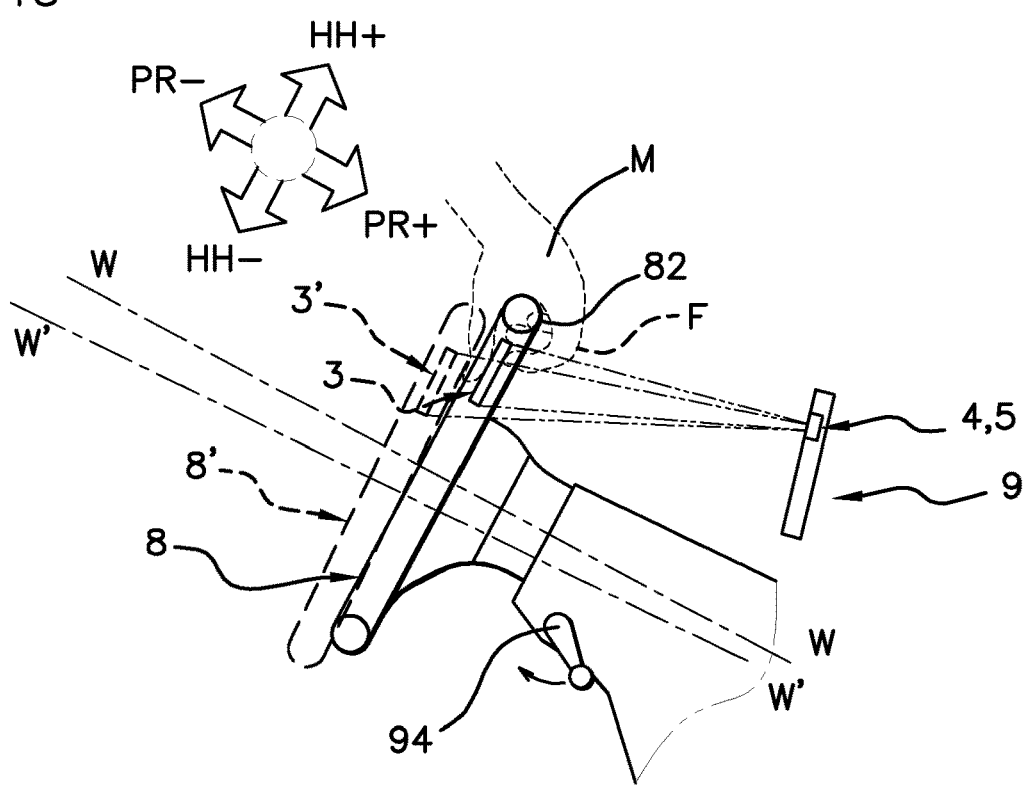
FIG. 13 illustrates the adjustment of the position of the steering wheel.

Moreover, a conventional system for adjusting the position of the steering wheel 8 comprises an unlocking handle 94 that, when it is activated, permits a depthwise movement in the directions PR+ and PR− and a heightwise movement in the directions HH+ and HH− (see FIG. 13). In the example, one position of the steering wheel 8, W has been shown with solid lines, and another position with dashed lines 8', W'. The interface pad 3 follows the movement and moves to the position 3'. The position of the zone of contrasts may vary, even depthwise, but this does not prevent the contrast effect from manifesting itself as soon as the driver presses on the movable plate 2.

It will be noted that the interface pad 3 contains no electronic components, solely elements participating in an optical function.

Moreover, the movable plate 2 and the base frame 1 could be transparent in the visible domain in order to limit the restriction of the driver's sight through the steering wheel 8.

The invention claimed is:

1. A system for detecting command gestures made by at least one finger (P) of a driver of a motor vehicle, the system comprising:
    at least one interface pad (3) located in proximity to the rim of the steering wheel (8),
    at least one light source (4) that emits an optical beam (L1) mainly in the near-infrared band toward the interface pad,
    an imaging sensor (5), for capturing at least images steered (L2) by the interface pad (3) away from the driver,
    wherein the interface pad (3) comprises a base frame (1) and a movable plate (2) that is movable between a rest position (P0) and at least one activation position (P1) obtained by pressing with a finger (P), the base frame (1) and the movable plate (2) lying generally in a reference plane XY and having a small thickness in the direction Z perpendicular to said reference plane XY,
    wherein the base frame (1) comprises a first inclined edge (11), which is beveled with respect to the reference plane XY, and the movable plate (2) comprises a second inclined edge (21), which is beveled with respect to the reference plane XY, arranged parallel to and facing the first inclined edge (11) in the direction Z, the first and second inclined edges (11, 21) forming a zone of contrasts of interest as seen by the imaging sensor (5),
    and wherein said first and second inclined edges (11, 21) are separated by a space or brought closer together depending on the position of the movable plate (2) and together generate an effect of contrast, in the images of the interface pad (3) that are captured by the imaging sensor (5), between the rest position and the activation position.

2. The system as claimed in claim 1, wherein, in the rest position of the movable plate (2) the first and second inclined edges (11, 21) are separated by an interval (G) of at least one preset distance, and in the activation position of the movable plate (2) the first and second inclined edges (11, 21) make contact with each other at least on one portion of the periphery.

3. The system as claimed in claim 1, wherein, in the rest position of the movable plate (2) the first and second inclined edges (11, 21) make contact with each other at least on most of the periphery, and in the activation position of the movable plate (2), the first and second inclined edges (11, 21) are separated by at least one interval (G) of a preset distance at least on one portion of the periphery.

4. The system as claimed in claim 2, such that, in the case of presence of the interval (G), seen from the imaging sensor (5), a low degree of optical return is obtained by virtue of an absorbent strip provided on the refractive optical path, whereas in the absence of interval (G) a high degree of optical return is obtained by virtue of a reflective strip provided on the direct optical path.

5. The system as claimed in claim 2, such that, in the case of presence of the interval (G), seen from the imaging sensor (5), a high degree of optical return is obtained by virtue of a reflective strip provided on the refractive optical path, whereas in the absence of interval (G) a low degree of optical return is obtained by virtue of an absence of reflection or by virtue of an absorbent strip provided on the direct optical path.

6. The system as claimed in claim 1, wherein the movable plate (2) is transparent at least to infrared light, so as to be able to detect movements of a finger inside the zone covered by the movable plate (2) through the movable plate (2).

7. The system as claimed in claim 1, wherein the first and second inclined edges (11, 21) are inclined at 45° with respect to the reference plane XY.

8. The system as claimed in claim 1, wherein the light source (4) emits in the near-infrared band, typically in the wavelength band 850-940 nm, and does not emit in the visible band.

9. The system as claimed in claim 1, wherein provision is made for an elastic return of the movable plate (2) to the rest position.

10. The system as claimed in claim 1, wherein provision is made to add a layer of optical gel to one or both inclined edges (11, 21) in order to improve the contact.

11. The system as claimed in claim 3, such that, in the case of presence of the interval (G), seen from the imaging sensor (5), a low degree of optical return is obtained by virtue of an absorbent strip provided on the refractive optical path, whereas in the absence of interval (G) a high degree of optical return is obtained by virtue of a reflective strip provided on the direct optical path.

12. The system as claimed in claim 3, such that, in the case of presence of the interval (G), seen from the imaging sensor (5), a high degree of optical return is obtained by virtue of a reflective strip provided on the refractive optical path, whereas in the absence of interval (G) a low degree of optical return is obtained by virtue of an absence of reflection or by virtue of an absorbent strip provided on the direct optical path.

13. The system as claimed in claim 2, wherein the movable plate (2) is transparent at least to infrared light, so as to be able to detect movements of a finger inside the zone covered by the movable plate (2) through the movable plate (2).

14. The system as claimed in claim 3, wherein the movable plate (2) is transparent at least to infrared light, so as to be able to detect movements of a finger inside the zone covered by the movable plate (2) through the movable plate (2).

15. The system as claimed in claim 4, wherein the movable plate (2) is transparent at least to infrared light, so as to be able to detect movements of a finger inside the zone covered by the movable plate (2) through the movable plate (2).

16. The system as claimed in claim 5, wherein the movable plate (2) is transparent at least to infrared light, so as to be able to detect movements of a finger inside the zone covered by the movable plate (2) through the movable plate (2).

17. The system as claimed in claim 2, wherein the first and second inclined edges (11, 21) are inclined at 45° with respect to the reference plane XY.

18. The system as claimed in claim 3, wherein the first and second inclined edges (11, 21) are inclined at 45° with respect to the reference plane XY.

19. The system as claimed in claim 4, wherein the first and second inclined edges (11, 21) are inclined at 45° with respect to the reference plane XY.

20. The system as claimed in claim 5, wherein the first and second inclined edges (11, 21) are inclined at 45° with respect to the reference plane XY.

* * * * *